United States Patent [19]
Tanino et al.

[11] Patent Number: 6,053,973
[45] Date of Patent: Apr. 25, 2000

[54] SINGLE CRYSTAL SIC AND A METHOD OF PRODUCING THE SAME

[75] Inventors: Kichiya Tanino; Masanobu Hiramoto, both of Sanda, Japan

[73] Assignee: Nippon Pillar Packing Co., Ltd., Osaka, Japan

[21] Appl. No.: 09/187,350

[22] Filed: Nov. 6, 1998

[30] Foreign Application Priority Data

Nov. 17, 1997  [JP]  Japan .................................. 9-315126

[51] Int. Cl.$^7$ ................................ C30B 1/04; B32B 9/04
[52] U.S. Cl. .............................. 117/4; 428/446; 428/620; 117/7; 117/9; 117/951; 117/84; 117/88; 117/94; 117/97
[58] Field of Search ................................ 117/4, 7, 9, 951, 117/84, 87, 88, 94, 97; 428/446, 620

[56] References Cited

U.S. PATENT DOCUMENTS 4,590,130  5/1986  Cline ....................................... 428/446
5,830,584  11/1998  Chen et al. ............................... 428/611
5,909,036  6/1999  Tanaka et al. ............................. 257/94

Primary Examiner—William Powell
Assistant Examiner—Donald L. Champagne
Attorney, Agent, or Firm—Jones, Tullar & Cooper, P.C.

[57] ABSTRACT

The surface $1a$ of a single crystal α-SiC substrate 1 is adjusted so as to have a surface roughness equal to or lower than 2,000 angstroms RMS, and preferably equal to or lower than 1,000 angstroms RMS. On the surface $1a$ of the single crystal α-SiC substrate 1, a polycrystalline α-SiC film 2 is grown by thermal CVD to form a complex is placed in a porous carbon container and the carbon container is covered with α-SiC powder. The complex is subjected to a heat treatment at a temperature equal to or higher than a film growing temperature, i.e., in the range of 1,900 to 2,400° C. in an argon gas flow, whereby single crystal α-SiC is integrally grown on the single crystal α-SiC substrate 1 by crystal growth and recrystallization of the polycrystalline α-SiC film 2. It is possible to stably and efficiently produce single crystal SiC of a large size which has a high quality and in which any crystal nucleus is not generated.

12 Claims, 2 Drawing Sheets

SINGLE CRYSTAL SIC AND A METHOD OF PRODUCING THE SAME

BACKGROUND OF THE INVENTION

1. Field of the Invention

The present invention relates to single crystal SiC and a method of producing the same, and more particularly to single crystal SiC which is used as a semiconductor substrate wafer for a light-emitting diode, an X-ray optical element such as a monochromatic sorter, a high-temperature semiconductor electronic element, and a power device, and also to a method of producing the single crystal SiC.

2. Description of the Prior Art

SiC (silicon carbide) is superior in heat resistance and mechanical strength, and also has good resistance to radiation. In addition, it is easy to perform the valence control of electrons and holes by doping an impurity. Moreover, SiC has a wide band gap (for example, single crystal 6H-SiC has a band gap of about 3.0 eV, and single crystal 4H-SiC has a band gap of 3.26 eV). Therefore, it is possible to realize a large capacity, a high frequency, a high dielectric strength, and a high resistance to environments which cannot be realized by existing semiconductor materials such as Si (silicon) and GaAs (gallium arsenide). For these reasons, single crystal SiC receives attention and is expected as a semiconductor material for a next-generation power device.

As a method of growing (producing) single crystal SiC of this type, employed are the Achison method and the sublimation and recrystallization method which are generally known as an industrial method of producing an SiC abrasive material. In the Achison method, a seed crystal substrate is heated from the outer circumference by using a high frequency electrode, so as to generate many nuclei in a center portion of the seed crystal substrate, whereby a plurality of spiral crystal growths are developed with being centered at the center portion of the seed crystal substrate. In the sublimation and recrystallization method, powder SiC produced by the Achison method is used as a raw material, and a crystal is grown on a single crystal nucleus.

In the Achison method of the above-described conventional production methods, however, a single crystal is grown slowly over a long time period, so that the crystal growth rate is very low. In addition, a large number of crystal nuclei are generated in an initial growth stage, and they propagate to an upper portion of the crystal as the crystal growth advances. Thus, it is difficult to singly obtain a large-size single crystal.

In the sublimation and recrystallization method, a high-speed growth of about 1 mm/hr is adopted mainly for an economical reason (production cost), so that impurities and pin holes which have a diameter of several microns and which pass through the crystal in the growing direction are likely to remain in a growing crystal. Such pin holes are called micropipe defects and cause a leakage current when a semiconductor device is fabricated. Accordingly, there exists a problem in that single crystal SiC having sufficiently good quality cannot be obtained. This blocks a practical use of SiC which has superior characteristics as compared with other existing semiconductor materials such as Si and GaAs as described above.

SUMMARY OF THE INVENTION

The invention has been conducted in view of the above-mentioned circumstances. It is an object of the invention to provide large-size single crystal SiC which has high quality and in which no crystalline nucleus is generated, and a method of producing single crystal SiC in which a single crystal having high quality can be stably efficiently produced at a higher growing rate.

In order to attain the above-mentioned object, the single crystal SiC of the invention is characterized in that a complex in which a polycrystalline α-SiC film is grown on a surface of a single crystal α-SiC substrate having an adjusted surface roughness equal to or lower than 2,000 angstroms RMS is subjected to a heat treatment at a high temperature equal to or higher than a film growing temperature, thereby forming single crystal α-SiC on the single crystal α-SiC substrate by crystal growth and recrystallization of the polycrystalline α-SiC film.

In order to attain the same object, the method of producing single crystal SiC of the invention is characterized in that a surface of a single crystal α-SiC substrate is adjusted to have a surface roughness equal to or lower than 2,000 angstroms RMS, a polycrystalline α-SiC film is grown on a surface of the single crystal α-SiC substrate, and the complex is heat-treated at a high temperature which is equal to or higher than a film growing temperature, whereby single crystal α-SiC is integrally formed on the single crystal α-SiC substrate by crystal growth and recrystallization of the polycrystalline α-SiC film.

According to the invention having the above-mentioned characteristics, as single crystal SiC, a single crystal α-SiC substrate in which surface physical unevenness is small and in which the surface roughness is adjusted so as to be equal to or lower than 2,000 angstroms RMS, and more preferably equal to or lower than 1,000 angstroms RMS is used. The surface roughness which is thus adjusted can easily eliminate a mismatch of a crystal lattice caused by a phenomenon in which phase transformation occurs simultaneously from a bottom face and a side face of a concave portion in a heat treatment. A complex in which a polycrystalline α-SiC film is grown on the surface of the substrate is subjected to a heat treatment at a high temperature which is equal to or higher than the film growing temperature, so that single crystal α-SiC can be integrally grown on the single crystal α-SiC substrate by recrystallization which is performed in imitation of the growth of the single crystal α-SiC on the substrate side and in a substantially entire region other than end portions of the poly crystal on the polycrystalline α-SiC film side. Accordingly, it is possible to stably and efficiently obtain single crystal SiC of a large size and having high quality in which crystal nuclei are not generated by the mismatch of a crystal lattice and any micropipe defect or the like cannot occur. Thus, it is possible to attain the effect of expediting the practical use of single crystal SiC which is superior in a large capacity, a high frequency, a high dielectric strength, and a high resistance to environments to existing semiconductor materials such as Si (silicon) and GaAs (gallium arsenide) and which is expected as a semiconductor material for a power device.

Other objects and effects of the invention will be clarified in embodiments which will be described below.

PREFERRED EMBODIMENTS OF THE INVENTION

Hereinafter, an embodiment of the invention will be described with reference to the drawings.

Figure 1:
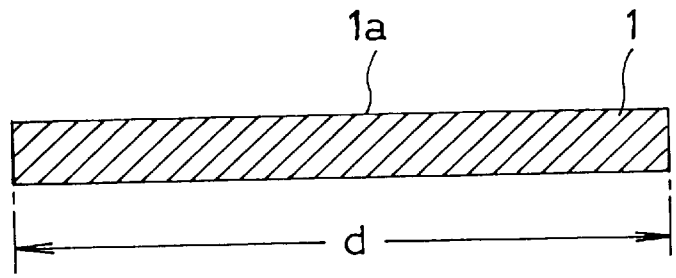
FIG. 1 is a side view showing a single crystal α-SiC substrate in the method of producing single crystal SiC according to the invention.

FIGS. 1 to 4 are views illustrating the method of producing single crystal SiC according to the invention, in the sequence of production steps. In FIG. 1, 1 denotes a single crystal hexagonal α-SiC substrate (6H type or 4H type) which is processed so as to have a disk-like shape of a diameter d of about 25 mm. The surface 1a of the single crystal α-SiC substrate 1 is ground or polished so as to remove physical unevenness. Specifically, the surface 1a is adjusted so as to have a surface roughness which is equal to or lower than 2,000 angstroms RMS, preferably equal to or lower than 1,000 angstroms RMS, and more preferably in the range of 100 to 500 angstroms.

Figure 2:
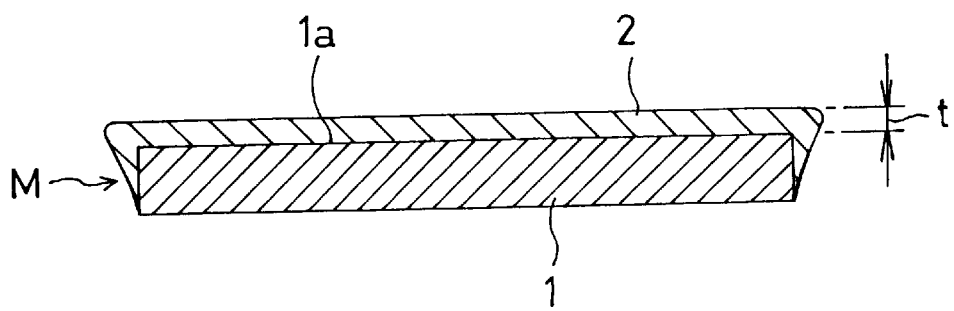
FIG. 2 is a side view showing a state in which a polycrystalline α-SiC film is grown by thermal CVD on the surface of the single crystal α-SiC substrate.

Thereafter, on the surface 1a of the single crystal α-SiC substrate 1, a polycrystalline α-SiC film 2 is grown as shown in FIG. 2 by thermal chemical vapor deposition (hereinafter referred to as thermal CVD) under conditions listed in Table 1 below. The polycrystalline α-SiC film 2 is grown so as to have a film thickness t of 200 to 500 μm, preferably about 300 μm.

TABLE 1

(Conditions of Thermal CVD)

| Reaction gas | carrier $H_2$<br>carbon source $CH_4$<br>silicon source $SiCl_4$ |
|---|---|
| Reaction temperature | 1,850° C. (equal to or higher than 1,650° C.) |
| Total gas pressure | 100 mbar (preferably 30 to 200 mbar) |
| Total gas flow rate | 50 l/min (preferably equal to or higher than 50 l/min) |
| Specification of substrate | single crystal α-SiC having a diameter of 25 mm |
| Film growing rate | 10 μm/hr |

Figure 3:
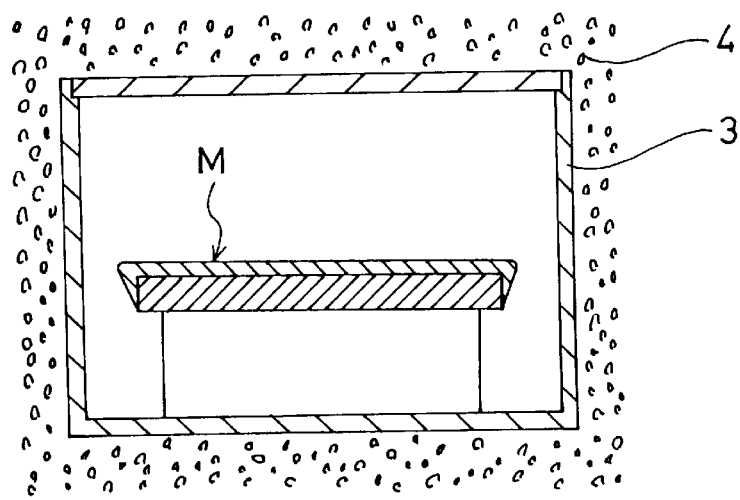
FIG. 3 is a schematic side view showing a heat treatment state of a complex.
Figure 4:
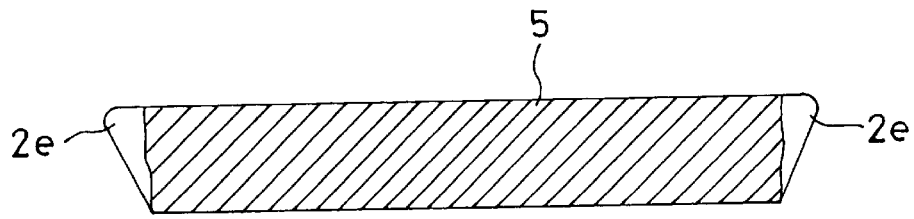
FIG. 4 is a front view showing single crystal SiC obtained by the heat treatment.

Next, a complex M consisting of the single crystal α-SiC substrate 1 and the polycrystalline α-SiC film 2 is accommodated in a porous carbon container 3 as shown in FIG. 3. Under a state where the outer side of the porous carbon container 3 is surrounded and covered with α-SiC powder 4, a heat treatment is performed in an argon gas flow at a temperature of 1,900 to 2,400° C., preferably 2,200° C. for about 2 hours. As a result, as shown in FIG. 4, in imitation of the growth of the single crystal of the single crystal α-SiC substrate 1, a polycrystal of the polycrystalline α-SiC film 2 is recrystallized to grow single crystal α-SiC 5 in an entire region other than end portions 2e and 2e of the polycrystalline α-SiC film 2 formed over the side face of the entire circumference of the single crystal α-SiC substrate 1. The single crystal α-SiC 5 is integrally grown in a range from the surface (crystal orientation face) 1a of the single crystal α-SiC substrate 1 to the polycrystalline α-SiC film 2. The single crystal α-SiC 5 has the same orientation as that of the crystal axis of the single crystal α-SiC substrate 1.

As described above, as the single crystal α-SiC substrate 1, used is a substrate with little physical unevenness in the surface, and having a surface roughness which is adjusted so as to be equal to or lower than 2,000 angstroms RMS, preferably equal to or lower than 1,000 angstroms RMS at which mismatch of the crystal lattice caused by simultaneous phase transformation from bottom and side faces of a concave portion in the heat treatment can be eliminated. The complex M which is formed by growing the polycrystalline α-SiC film 2 on the surface of the substrate 1 is subjected to the heat treatment at a high temperature (2,200° C., 2 hours) which is equal to or higher than the film growing temperature (1,850° C.) in the thermal CVD. As a result, in imitation of the growth of the single crystal α-SiC on the side of the substrate 1, the polycrystal on the side of the polycrystalline α-SiC film 2 is recrystallized in a substantially entire region other than the end portions of the film growing portion. Thus, the single crystal α-SiC which is orientated in the same direction as the crystal axis of the single crystal α-SiC substrate 1 is integrally grown. In this way, it is possible to efficiently produce single crystal SiC of a large size and with high quality in which any crystal nucleus caused by the mismatch of the crystal lattice is not generated in an interface and any micropipe defect does not occur.

In this connection, results shown in Table 2 below were obtained when the surface roughness of the single crystal α-SiC substrate 1 was variously changed and the crystal qualities of respective single crystal α-SiC produced by the above-described producing process were evaluated by X-ray diffraction. As for the numerical values shown in Table 2, the values in the upper row denote values of the surface roughness RMS (unit: angstrom), and those in the lower row denote half band widths (integrated intensity ratio) of an X-ray rocking curve of (0006) reflection of the respective single crystals. Each half band width was obtained by averaging measured values at arbitrary five points.

TABLE 2

| Surface roughness | RMS 3,000 Å | 2,000 Å | 1,000 Å | 500 Å |
|---|---|---|---|---|
| Half band width | 6° | 2° | 0.8° | 0.9° |

As apparent from Table 2 above, when the surface roughness of the single crystal α-SiC substrate 1 is 2,000 angstroms RMS, the half band width is rapidly narrowed. Thus, it is understood that there is no variation in crystal quality and the crystals are good in unity.

In addition, in the heat treatment of the complex M, the complex M is placed in the porous carbon container 3, and the outer side of the carbon container 3 is covered with the α-SiC powder 4. The predetermined heat treatment is performed in the argon gas flow, so that the α-SiC powder 4 is decomposed in a high temperature atmosphere. At least part of the decomposed Si and C is moved into the porous carbon container 3 through the container 3, so that the predetermined heat treatment can be performed in a saturated SiC vapor atmosphere. Accordingly, the decomposition of the single crystal α-SiC substrate 1 and the polycrystalline α-SiC film 2 can be suppressed, and it is possible to produce single crystal SiC of higher quality. Moreover, it is possible to prevent the Si and C which are moved into the porous carbon container 3 through the container 3, from adhering to SiC before phase transformation. Accordingly, it is possible to produce good single crystal with higher quality.

The entire disclosure of Japanese Patent Application No. 9-315126 filed on Nov. 17, 1997 including specification, claims, drawings, and summary are incorporated herein by reference in its entirety.

What is claimed is:

1. Single crystal SiC wherein
   a complex in which a polycrystalline α-SiC film is grown on a surface of a single crystal α-SiC substrate having an adjusted surface roughness equal to or lower than 2,000 angstroms RMS is subjected to a heat treatment at a high temperature equal to or higher than a film growing temperature, thereby forming single crystal α-SiC on said single crystal α-SiC substrate by crystal growth and recrystallization of said polycrystalline α-SiC film.

2. Single crystal SiC according to claim 1, wherein the surface roughness of said single crystal α-SiC substrate is adjusted to be equal to or lower than 1,000 angstroms RMS.

3. Single crystal SiC according to claim 1, wherein said polycrystalline α-SiC film is grown by thermal chemical vapor deposition.

4. Single crystal SiC according to claim 2, wherein said polycrystalline α-SiC film is grown by thermal chemical vapor deposition.

5. A method of producing single crystal SiC, wherein a surface of a single crystal α-SiC substrate is adjusted to have a surface roughness equal to or lower than 2,000 angstroms RMS, a polycrystalline α-SiC film is grown on the surface of said single crystal α-SiC substrate, and the complex is then heat-treated at a high temperature which is equal to or higher than a film growing temperature, whereby single crystal α-SiC is integrally formed on said single crystal α-SiC substrate by crystal growth and recrystallization of said polycrystalline α-SiC film.

6. A method of producing single crystal SiC according to claim 5, wherein the surface roughness of said single crystal α-SiC substrate is adjusted to be equal to or lower than 1,000 angstroms RMS.

7. A method of producing single crystal SiC according to claim 5, wherein said polycrystalline α-SiC film is grown by thermal chemical vapor deposition.

8. A method of producing single crystal SiC according to claim 6, wherein said polycrystalline α-SiC film is grown by thermal chemical vapor deposition.

9. A method of producing single crystal SiC according to claim 5; wherein the heat treatment of said complex is performed under a state where said complex is placed in a porous carbon container, and an outer side of said porous carbon container is covered with α-SiC powder, and at a temperature in a range of 1,900 to 2,400° C.

10. A method of producing single crystal SiC according to claim 6, wherein the heat treatment of said complex is performed under a state where said complex is placed in a porous carbon container, and an outer side of said porous carbon container is covered with α-SiC powder, and at a temperature in a range of 1,900 to 2,400° C.

11. A method of producing single crystal SiC according to claim 7, wherein the heat treatment of said complex is performed under a state where said complex is placed in a porous carbon container, and an outer side of said porous carbon container is covered with α-SiC powder, and at a temperature in a range of 1,900 to 2,400° C.

12. A method of producing single crystal SiC according to claim 8, wherein the heat treatment of said complex is performed under a state where said complex is placed in a porous carbon container, and an outer side of said porous carbon container is covered with α-SiC powder, and at a temperature in a range of 1,900 to 2,400° C.

* * * * *